United States Patent
Wiersma et al.

(10) Patent No.: US 8,948,561 B2
(45) Date of Patent: Feb. 3, 2015

(54) WAVEGUIDE FOR EFFICIENT LIGHT TRAPPING AND ABSORPTION

(75) Inventors: Diederik Sybolt Wiersma, Vaglia (IT); Francesco Riboli, Florence (IT); Kevin Vynck, Florence (IT); Matteo Burresi, Florence (IT)

(73) Assignee: CNR—Consiglio Nazionale Delle Ricerche, Rome (IT)

( * ) Notice: Subject to any disclaimer, the term of this patent is extended or adjusted under 35 U.S.C. 154(b) by 142 days.

(21) Appl. No.: 13/820,391

(22) PCT Filed: Sep. 2, 2010

(86) PCT No.: PCT/IT2010/000381
§ 371 (c)(1),
(2), (4) Date: Mar. 1, 2013

(87) PCT Pub. No.: WO2012/029081
PCT Pub. Date: Mar. 8, 2012

(65) Prior Publication Data
US 2013/0163942 A1 Jun. 27, 2013

(51) Int. Cl.
*G02B 6/42* (2006.01)
*G02B 6/10* (2006.01)
(Continued)

(52) U.S. Cl.
CPC . *G02B 6/02* (2013.01); *B82Y 20/00* (2013.01); *G02B 6/1225* (2013.01); *H01L 31/0524* (2013.01); *G02B 6/1226* (2013.01); *Y02E 10/52* (2013.01); *Y10S 385/90* (2013.01)
USPC ............ 385/130; 385/900; 385/27; 385/39; 136/257; 136/252; 136/256; 438/69; 257/432; 257/436; 257/E31.127

(58) Field of Classification Search
USPC ......... 385/27, 34, 39, 49, 129–132, 146–147, 385/900; 136/243, 244, 246, 252, 255–259, 136/261; 438/31, 69, 71–72, 98–99; 257/76, 88, 432, E31.004, E31.124, 257/E31.127, E31.13
See application file for complete search history.

(56) References Cited

U.S. PATENT DOCUMENTS

| 4,554,727 A | 11/1985 | Deckman et al. | |
| 8,463,092 B2* | 6/2013 | Farahi | 385/34 |

OTHER PUBLICATIONS

Sang Eon Hand and Gang Chen, "Optical Absorption Enhancement in Silicon Nanohole Arrays for Solar Photovoltaics", Nano Letters, Jan. 1, 2010, pp. 1012-1015, vol. 10(3), ACS, Washington, DC, US.
(Continued)

*Primary Examiner* — Akm Enayet Ullah
*Assistant Examiner* — Michael Mooney
(74) *Attorney, Agent, or Firm* — Volpe and Koenig, P.C.

(57) ABSTRACT

A waveguide is provided on which an electromagnetic wave impinges, the electromagnetic wave having a wavelength λ included in a given interval Δλ of interest centered on a $\lambda_{centr}$. The waveguide comprises a film defining a surface on a plane on which the electromagnetic waves are apt to impinge, having a thickness in a direction substantially perpendicular to the surface, the film being realized in a material having a first refractive index; a plurality of scatterers being randomly distributed in two directions in at least a portion of the surface of the film, the scatterers having a substantially constant cross section along said substantially perpendicular direction. The scatterers are realized in a material having a second refractive index lower than the first refractive index, wherein the wavelength of the incident electromagnetic waves is comprised between $$0.1 < \frac{\Delta\lambda}{\lambda_{centr}} \leq 3$$

and the area of the cross section of said scatterers is between $$\pi \cdot (\Phi_{ref}/6)^2 \leq A_{scatt} \leq \pi \cdot \Phi_{ref}^2 \text{ where } \Phi_{ref} = \frac{n_{scatt}}{n_{film}} \cdot \lambda_{centr}.$$

18 Claims, 5 Drawing Sheets

(51) Int. Cl.
*H01L 21/00* (2006.01)
*H01L 31/00* (2006.01)
*H01L 27/142* (2014.01)
*G02B 6/02* (2006.01)
*B82Y 20/00* (2011.01)
*G02B 6/122* (2006.01)
*H01L 31/052* (2014.01)

(56) References Cited

OTHER PUBLICATIONS

Scwartz et al., "Transport and Anderson localization in disordered two-dimensional photonic latttices", Nature, Mar. 1, 2007, pp. 52-55, vol. 446, Nature Publishing Group, London, GB.

Chenxi et al., "Optical absorption enhancement in silicon nanowire and nanohole arrays for photovoltaic application", Lasers and Electro-Optics (CLEO) and Quantum Electronics and Laser Science Conference (QELS), May 16, 2010, pp. 1-2, IEEE, Piscataway, NJ, US.

Xing et al., "Low-cost, Deterministic Quasi-periodic Photonic Structures for light trapping in thin film silicon solar cells", Photovoltaic Specialists Conference (PVSC), Jun. 7, 2009, pp. 2395-2398, IEEE, Piscataway, NJ, US.

Wang et al., "Optical absorption enhancement in nanopore textures-silicon thin film for photovoltaic applicaton", Optics Letters, Jan. 1, 2010, pp. 40-42, vol. 35(1), Optical Society of America, Washington, DC, US.

Schwartz et al., "Transport and Anderson localization in 2-dimensional photonic lattices", Lasers and Electro-Optics and 2006 Quantum Electronics and Laser Science Conference, May 21, 2006, pp. 1-2, IEEE, Piscataway, NJ, US.

Kappera et al., "Nanohole structures for efficiency enhancement in thin film photovoltaics", 2010 International Conference on Photonics (ICP), Jul. 5, 2010, pp. 1-5, IEEE, Piscataway, NJ, US.

\* cited by examiner

WAVEGUIDE FOR EFFICIENT LIGHT TRAPPING AND ABSORPTION

TECHNICAL FIELD

This invention concerns a coupling waveguide in which interference effects due to multiple scattering of electromagnetic waves in two-dimensional disordered structures (planar disordered structures) are used in order to capture and absorb waves efficiently from the third dimension, i.e. from the out-of-plane directions. The waveguide of the invention couples incident electromagnetic waves which are then absorbed—and possibly trapped—in the waveguide itself.

TECHNOLOGICAL BACKGROUND

Transport of electromagnetic waves in random media is known to be of great importance on both fundamental and applied levels. It may be described as a multiple scattering process, where the direction and phase of propagating waves is randomized due to spatial fluctuations of the refractive index. For strong scattering, interferences between scattered waves are significant, leading to weak and possibly strong localization. Strong localization is also called Anderson localization. Anderson localization is a general wave phenomenon that applies to the transport of electromagnetic waves, acoustic waves, quantum waves, spin waves, etc and it finds its origin in the wave interference between multiple-scattering paths.

Reports of Anderson localization of light in 3-dimensional (3D) random media have been made, such as in Wiersma et al., Nature, 390, pages 671-673 (1997) and in Störzer et al., Phys. Rev. Lett. 96, 63904 (2006), even though absorption may complicate interpretation of experimental results.

US patent application n. 2003/0133681 provides a waveguiding device and a method for guiding electromagnetic (EM) waves, in particular surface plasmon polaritons (SPPs), using strongly scattering random media exhibiting light localization. Also, the invention provides a cavity for providing resonance conditions for EM waves, in particular surface plasmon polaritons using strongly scattering random media exhibiting light localization. In a strongly scattering random medium with a high enough density of scatterers (so that the average distance between scatterers is smaller than the wavelength), EM waves can only exist in localized modes and can therefore not propagate. By forming regions free from scatterers in the regions with randomly distributed scatterers, the localization effects in scattering media can be utilized to guide propagating modes in these regions. The invention can be used to form compact integrated optical components and circuits.

Recently, localization of electromagnetic waves has been shown also in disordered 2D lattice.

In "*Transport and Anderson localization in disordered two-dimensional photonic lattices*", written by Schwartz et al. and published in "Nature", Vol. 446, pages 52-55 (2007), an experimental observation of Anderson localization in perturbed periodic potential is reported: the transverse localization of light is caused by random fluctuations on a two dimensional photonic lattice. In the article, it is demonstrated how ballistic transport becomes diffusive in the presence of disorder, and that crossover to Anderson localization occurs at a higher level of disorder.

U.S. Pat. No. 7,615,735 discloses a method and apparatus for random number generation using a scattering waveguide. The apparatus includes a light source for providing coherent light and a scattering waveguide for receiving the coherent light and providing scattered light. The relative position of the light source and the scattering waveguide are variable. The apparatus also includes a detector for forming at least one random number based on the scattered light.

Various techniques intended to increase the absorption efficiency of thin films exist (a film is considered "thin" when the ratio between the physical thickness of the film and the absorption mean free path—i.e. the characteristic length over which the amplitude of the electromagnetic wave is decreased by a factor of 1/e—is equal or lower than 1).

Known examples are:
- thin film in which a randomly textured surface is present (improved coupling);
- thin film in which metallic nanoparticles exhibiting surface plasmon resonances on the surface are deposited (improved coupling and near-field enhancement);
- thin film in which there are periodic electromagnetic structures (improved coupling to guided modes and/or increased light-matter interaction by slow modes);
- thin film in which there are graded-index structures (improved coupling).

Most of these techniques have been developed for solar cell technologies to enhance light absorption. These approaches, however, hold for electromagnetic waves in general, owing to the scalability of Maxwell's equations (there is no intrinsic length scale), as well as for weakly scattering materials.

The following problems are commonly encountered in some of the above listed examples:
- Small bandwidth: enhancement of the absorption is only observed on a small range of wavelengths due to the fact that it relies on single resonances of the structure or scatterer that are narrow in frequency (e.g. periodic electromagnetic structures, plasmon-enhanced absorption);
- Poor coupling at large angles: the amount of light coupled to the structure at large angles is reduced or suppressed due to the high value of the reflection coefficients;
- Poor suitability for ultra-thin films: the improvement of coupling efficiency requires a minimal thickness to be effective (randomly textured surface, graded-index structures);
- Undesired absorption by additional material: the inclusion of defects (e.g. scatterers) that are absorbing electromagnetic waves reduces the amount of waves effectively in interaction with the film material (metallic nanoparticles for plasmon-enhanced absorption);
- Poor suitability to large-scale low-cost production: the technique is extremely sensitive to any deviations from its original design and/or time and cost consuming for reproduction on large scales (periodic electromagnetic structures).

In "*Optical Absorption Enhancement in Silicon Nanohole Arrays for Solar Photovoltaics*", written by Sang Eon Han et al., published in Nano Letters, 2010, 10, pages 1012-1015, silicon periodic nanohole arrays as light absorbing structures for solar photovoltaics via simulation is investigated. To obtain the same ultimate efficiency as a standard 300 μm crystalline silicon wafer, it is found that nanohole arrays require twelve times less silicon by mass. Moreover, calculations show that nanohole arrays have an efficiency superior to nanorod arrays for practical thicknesses. With well-established fabrication techniques, nanohole arrays have great potential for efficient solar photovoltaics.

U.S. Pat. No. 4,554,727 is relative to a method for producing an optical enhanced thin film photovoltaic device. The method includes the steps of producing an active layer of semiconductor material wherein the surface of at least one side of the active layer is textured such that the surface includes randomly spaced, densely packed microstructures of predetermined dimensions of the order of the wavelength of visible light in the semiconductor material and attaching a reflecting surface directly to one side of the semiconductor material and making an ohmic contact to the material.

In "*Engineering the randomness for enhanced absorption in solar cells*" written by Stephan Far et al. and published in Applied Physics Letters 92, 171114 (2008), photon management by means of random textured surfaces is known to be a promising route to increase the light absorption in a solar cell. To date this randomness was only a posteriori assessed and related to the absorption. Here, the authors outline a meaningful strategy for a priori and purposely tailoring the randomness. By defining appropriate angular scattering functions and optimizing the surface profiles, it is shown that the number of absorbed photons can be enhanced by 55% compared to flat-surface solar cells.

SUMMARY OF THE INVENTION

The propagation of waves in arbitrary media is governed by the four macroscopic Maxwell's equations, which in SI units are as follows:

$$\nabla \cdot D = \rho_f$$
$$\nabla \cdot B = 0$$
$$\nabla \times E = -\frac{\partial B}{\partial t}$$
$$\nabla \times H = J_f + \frac{\partial D}{\partial t}$$

where E and H are the electric and magnetic fields, D and B are the displacement and magnetic induction fields, and p and J are the free charges and currents, generally taken to be zero. The propagation of light in an homogeneous material is simple: light propagates in straight trajectories. When light impinges on a inhomogeneity, it is scattered changing its direction of propagation. The inhomogeneity is thus called defect or scatterer.

A feature of electromagnetism in random media is that there is no fundamental length scale (see the Maxwell equations, for example), apart from the distance between scatterers and their size. Therefore, all electromagnetic problems can be rescaled by contracting or expanding all distances.

Wave transport in random media is described by the transport mean free path, which is related directly to the scattering mean free path, that is, the average distance between two scattering events. This quantity is inherent to the size, shape, index contrast and density of scatterers in the embedding medium. Thus, sets of scatterers, randomly and homogeneously distributed in space, make it possible to have a fine control over transport. More in particular, when scattering becomes strong, interference plays an important role. If scattering becomes strong enough, light can be spatially localized, which means that it cannot propagate.

It is known that in 3D Anderson localization is a phase transition phenomenon, i.e. there exists a phase transition between localized and diffuse transport regime. The scattering strength in a disordered scattering medium is described by the inverse of the localization parameter $kl_s$, where $$kl_s = \frac{2\pi}{\lambda_0} n_e l_s$$

and k is the wave vector in the medium, $I_s$ the scattering mean free path, $n_e$ the effective refractive index of the medium and $\lambda_0$ the wavelength of light in vacuum. Localization is obtained for $kl_s \leq 1$, which means that when the scattering mean free path becomes much smaller than the wavelength of the wave, the 3D system can localize light. In dimensions lower than 3, e.g. in 1D and 2D systems, in theory localized states exist for any type of disorder of the scatterers in infinite medium.

Applicants have studied two-dimensional random systems having a finite size, i.e. a film of finite thickness t along a Z direction in the context of localization and absorption of light.

While in principle all states in 2D structures are localized, the real systems have to take into consideration the finite-size effects and the non-zero losses rates, which means that certain conditions need to be fulfilled in order to obtain localized states.

The invention relates to a waveguide structure comprising a film which defines a surface in a (X,Y) plane that includes a portion having a disordered set of defects of arbitrary cross-section, defects which are disordered in the so defined (X,Y) plane, while they are invariant in translation in a direction substantially perpendicular to such a plane (i.e. in the Z direction), in other words their cross section along the thickness t of the film is constant. In the following, the defects will be called "scatterers". Of course due to fabrication tolerances, the defects are "perpendicular" to the plane within the inherent limits and possible errors due to standard fabrication processes. For example these defects might have an inclination of ±5 from the Z direction.

This waveguide structure of the invention it is not fully 2-dimensional due to the finite thickness of the waveguide, however it is not 3-dimensional as well due to the fact that the scatterers have a certain pattern only in 2D while they are translationally invariant in the third dimension over the film thickness t.

On the waveguide above described, it is considered that electromagnetic waves impinge on the (X,Y) surface of the film, and these waves are generic, i.e. there are no constrains on their polarization or angle of incidence. Each electromagnetic wave has a certain wavelength and an angle of incidence with respect to the normal to the (X,Y) plane.

The film of the invention is a guiding film, i.e. it corresponds to the core of a waveguide which also means that the media surrounding it (for example air or other materials) and forming the cladding has preferably a permittivity which is lower than the permittivity of the film, as long as the mode is confined within the film, is also included in the present invention. As an example, a metal layer may be in contact with the film (the permittivity of a metal film might be even negative). More preferably, the refractive index of the material(s) forming the cladding is lower than the refractive index of the film.

Additionally, the cladding might be considered to be divided in top and bottom cladding positioned respectively below and above the guiding film (however any other spatial configuration is comprised in the present invention, bottom and top might be considered as the claddings in contact with the two opposite surfaces of the film). Preferably, the top cladding is at least partially optically transparent, so that the electromagnetic wave impinging in the waveguide is not blocked by the top cladding but can impinge on the film itself.

More preferably both top and bottom claddings are at least partially optically transparent for the incident electromagnetic radiation.

As an example, the top cladding can be air while the bottom cladding can be a substrate, such as glass.

In addition, the portion of the film including the scatterers is locally flat, which means that the curvature radius of a possible bend present in the waveguide should be larger than 10 times the scattering mean free path $l_s$. In other words, the portion of the film in which there are the scatterers can be bent or present a certain curvature, as long as locally the above mentioned relationship is satisfied. Outside the portion above defined, i.e. where there are no scatterers, the film might form bends or corners, i.e. it might follow any behavior.

According to the invention, as said, the locally flat portion includes a plurality of scatterers realized in a given material (i.e. filled by a certain material), whose refractive index is lower than the refractive index of the material in which the film is realized, distributed in a disordered (random) manner in the (X,Y) plane. The geometrical parameters of the defects, in particular their refractive index and cross-section, are determined such that they strongly scatter electromagnetic waves on a broad range of wavelengths.

The meaning of "random" can be defined as follows: called d the distance between two centers of mass in the (X,Y) plane of two different scatterers which are the nearest neighbors, the probability distribution of such a distance is called P(d). The mean value of such a distribution is defined as $$\langle x \rangle = \Sigma d \cdot P(d) \quad (1)$$

and the variance $$\langle x \rangle = \Sigma d^2 \cdot P(d). \quad (2)$$

The disorder's definition given in the present description is the following: the parameter $$s = \langle x^2 \rangle / \langle x \rangle \quad (3)$$

can be related to the amount of disorder present among the scatterers. For example, in a photonic crystal, where the defects are completely ordered according to the crystal structure, s=0 (in real photonic crystals, due to unavoidable defects, s is probably around 2% or 3%) because $\langle x^2 \rangle = 0$. The film of the waveguide of the present invention includes scatterers which are distributed in a disordered way, which in this contest means that calculating the parameter s according to equation (3) it is obtained s>5%, more preferably s>50%, even more preferably 50%≤s≤200%.

This scatterers' random distribution has to be present at least in a portion of the film, i.e. the scatterers have to be randomly distributed in the portion of the film in which they are present. The remaining part of the film may include no scatterers at all, i.e. there is a single portion of the film which includes scatterers, or the portion containing the plurality of disordered scatterers can be repeated to cover a larger fraction of the film, i.e. the portion containing the disordered scatterers can be considered as a "unit cell" which is duplicated several times and the film includes a plurality of such units one adjacent to the other in a periodical distribution. According to a different embodiment, a gap free of scatterers can be present between one unit and the other.

Preferably, the minimum number of scatterers in such a unit cell is equal to 10.

The cross section of the defects on the (X,Y) plane, which remains substantially identical along the Z direction, can be of any type, e.g. circular, elliptic, squared, etc. They are anyhow cylinders, in the generic meaning of the term: "a cylinder is defined more broadly as any ruled surface spanned by a one-parameter family of parallel lines". In addition, the cross sections of different scatterers can also be different, i.e. the type of cross section can vary among scatterers. Preferably, the type of cross section has also a random distribution among scatterers, however given a certain cross section it remains the same for the whole film thickness. It has to be understood that the meaning of "the same" and "identical" has always to take into consideration the inevitable errors and tolerances which are caused by the fabrication steps to obtain the waveguide.

According to a preferred embodiment of the invention, the scatterers span the whole thickness of the film, i.e. the height of the cylinder defined by each scatterer is substantially identical to the thickness t of the film. Even more preferably they have circular cross section and they are through-holes, filled with air.

Applicants have found that the waveguide structure above described leads to an enhancement of the absorption of electromagnetic waves on a broad range of wavelengths and angles of incidence. This enhancement relies on an improvement of the coupling of electromagnetic waves from three-dimensional space to the two-dimensional film and on interferences between waves within the film, thanks to the strong scattering.

The meaning of the term "enhancement" of absorption has to be understood as follows: considering the waveguide of the invention, the absorption of an incident light having a defined wavelength is higher than the absorption of a waveguide having the same physical parameters but without defects (=scatterers). It will be shown also that the absorption is also higher in most cases than for a photonic crystal.

This enhancement of absorption is obtained when strong scattering is present, which can be defined as follows. As said, the waveguide of the invention can be used in a broad range of wavelengths. Selected a given spectrum of wavelengths in which the user is interested in having absorption, this spectrum can be described substantially as a Gaussian having a given full width at half maximum (FWHM) which will be called in the following $\Delta\lambda$ and a mean wavelength $\lambda_{centr}$. $\lambda_{centr}$ is a reference wavelength in the range of wavelengths of interest, it can be considered the "center wavelength" of the range of interest within which the wavelength of the electromagnetic radiation impinging the surface of the film is comprised. The following relationship has to be satisfied by the incident electromagnetic radiation on the film having a wavelength $\lambda$ in the present invention:

$$0.1 < \frac{\Delta\lambda}{\lambda_{centr}} \leq 3. \quad (4)$$

In addition, a "reference diameter" of the scatterers can be defined as $$\Phi_{ref} = \frac{n_{scatt}}{n_{film}} \cdot \lambda_{centr} \quad (5)$$

where $n_{scatt}$ is the refractive index of the material forming the scatterers and $n_{film}$ is the refractive index of the material in which the film is realized. Given this definition, also an area $A_{scatt}$ of a scatterer included in the waveguide of the invention, regardless of the shape of its cross section or of the definition of a diameter (for some shapes it is complex to define a diameter of such a scatterer), can also be defined. In order to have strong scattering, the area of the scatterers $A_{scatt}$ should be such that it is preferably equal or greater than a minimum area defined as $A_{min} = \pi (\Phi_{ref}/6)^2$, i.e.

$$A_{scatt} \geq A_{min} = \pi \cdot (\Phi_{ref}/6)^2. \quad (6)$$

More preferably, the area of the cross section in the (X,Y) plane of the scatterers included in the film of the invention is within the following range:

$$\pi \cdot (\Phi_{ref}/6)^2 \leq A_{scatt} \leq \pi \cdot \Phi_{ref}^2. \quad (7)$$

The film is realized in an absorbing material.

Moreover, preferably the filling fraction of the scatterers within the portion of the film in which they are present, filling fraction which is defined as the sum of the areas of the scatterers cross sections in the (X,Y) plane divided by the total area of the same portion of the film in which the scatterers are present, is below 80%. More preferably, the filling factor of the scatterers in the waveguide of the invention is comprised between 15% and 50%.

Given a certain structure of the waveguide of the invention among the ranges above defined, i.e. given a waveguide satisfying eq. (4) and eq. (7), and having the random distributed scatterers, this results in a trapping waveguide in which there is a significant enhancement of the absorption of the incident radiation, for incident waves having a broad range of wavelengths, i.e. for a broad range of wavelengths around to $\lambda_{centr}$ the absorption enhancement is achieved. Indeed, the bandwidth of operation is large due to the fact that the defects typically have a finite scattering cross-section on a broad range of wavelengths.

In addition, the above enhancement is obtained for any arbitrary angle of incidence of the electromagnetic wave on the (X,Y) surface. Probably, disorder implies the creation of electromagnetic modes in the structure spanning the entire reciprocal space and lossy in the out-of-plane (Z) direction. Therefore, coupling from three-dimensional space to the "two-dimensional" film is efficient, even at large angles of incidence.

Preferably, the absorption mean free path of the film material is larger than the thickness t of the film.

In the solar cell application, preferably the thickness of the film is comprised between 50 nm and 10 μm, more preferably between 200 nm and 5 μm, even more preferably between 500 nm and 2 μm. For different applications, depending on the wavelength of the impinging electromagnetic wave, the thickness is also rescaled.

Preferably, the materials in contact with the lower and upper surfaces of the film including the scatterers are the same. In addition, preferably only the film contains the scatterers, while the cladding of the waveguide, i.e. the material in contact to the film, is free from these defects. Indeed, the absorption enhancement is more efficient when the absorbing film has a symmetric environment. In such a case, modes in the film are present for all film thicknesses at all frequencies.

In addition, Applicants have found that under certain conditions, in particular when the scattering mean free path $l_s$ is smaller than few minimum units (i.e. minimum unit=the smallest cell having 10 scatterers), the mentioned waveguide of the invention can "localize" the mode, i.e. the incident light which is coupled in the waveguide is then also localized, as it will be better shown below.

The waveguide of the invention is not sensitive to the position of one particular scatterers. Therefore, inaccuracy in the position of particular defects is irrelevant, simplifying the production steps for the realization of such a waveguide.

More in particular, the absorption enhancement in randomly structured films is shown by Applicants by a series of simulations using the three-dimensional finite-difference time-domain method, which solves numerically the Maxwell's equations in time and space. The parameter a (arbitrary unit length) can be introduced, to show that it is possible to scale the ranges and all the dimensions of the waveguide of the invention. The basic structure of the waveguide, as shown in FIG. 2 (an experimental realization of which is the above described sample of FIG. 11), consists of a film of thickness 0.26a, where a as said is the unit of length of the waveguide, and complex permittivity e=12+0.1i at a/λ=0.6 (an implicit time dependence in exp(-iωt), where ω is the angular frequency (rad·s$^{-1}$) and t the time, is used) which gives an absorption length of 9.19a. The cylindrical defects are circular holes (e=1) of radius 0.125a. In this example a/$\lambda_{centr}$=1.14. The filling fraction of the holes is 30%. The size of the structure is a square of side 8a comprising 321 holes. Perfectly matched layers are imposed in the vertical direction and periodic boundary conditions on the transverse directions. The absorption is evaluated by integrating the flux of the Poynting vector above and below the slab and subtracting the sum of the two to one. Comparisons are made with the results obtained for a film without holes and with those for a film with a periodic array of holes (square lattice). In both cases, the parameters of the film are identical to those of the randomly structured film. In the latter case, the parameters of the holes and their filling fraction are identical to those of the randomly structured film (square lattice).

FIG. 3 is a graph showing the absorption spectrum by the randomly structured film of the invention (shown in FIGS. 1 and 2, the simulations are performed using a waveguide having the dimensions above described with reference to FIG. 2), a periodically structured film (having a square lattice of scatterers) and a bare film (no defects) for a planewave at normal incidence at reduced frequencies a/λ between 0.5 and 1.1, where λ is the wavelength of the incident electromagnetic wave. For the bare film, the absorption spectrum displays a small oscillation due to Fabry-Pérot resonances and remains lower than 5% over the entire frequency range under consideration. For the periodically structured film, the absorption spectrum remains close to that of the bare film, with the exception of large (up to 0.54) and narrow absorption peaks, due to the coupling to Bloch modes of the periodic electromagnetic structure. For the waveguide of the invention, the absorption, which starts at a level comparable to that of the bare film, becomes larger for reduced frequencies higher than 0.55 reaching values between 15 and 20%. Oscillations are also present due to Fabry-Pérot resonances. The absorption enhancement is evaluated by integrating the absorption over the reduced frequency range a/λ between 0.5 to 1.1. It was found that absorption is enhanced by 74% in the periodically structured film and 387% in the waveguide of the invention with comparison to the bare film. Therefore, although the absorption for a given wavelength (e.g. in the large absorption peaks) in a periodic structure can be higher than in the waveguide of the present invention with a random distribution of scatterers for this specific wavelength, when a wavelengths' range is considered, i.e. the absorption is integrated over a reduced frequency range a/λ, the sharp absorption increase is verified.

Applicants have considered the absorption enhancement obtained and they believe that this absorption in random media may be provided by a reduction of the scattering mean free path in the medium due to the presence of scatterers. FIG. 4 shows the scattering mean free path as a function of the reduced frequency. The calculation has been performed by using Mie theory for infinite circular cylinders. The finite thickness of the film has been evaluated from an effective, non absorbing, medium approximation. Only the p-polarization has been considered since it is the dominant scattering component for lower-index defects in higher-index media, yielding a wavelength-dependent effective refractive index $n_{eff}(\lambda/a)=3.61-0.45\lambda/a$, where $\lambda$ is the wavelength of the incident electromagnetic wave. The absorption enhancement, as shown in FIG. 3, is found to be consistent with the decrease of the scattering mean free path at larger reduced frequencies. However, while the latter is steadily decreasing, the absorption remains at values close to 20%. The decay rate of the randomly structured film was evaluated to understand this effect. Finite-difference time-domain calculations have been performed considering 20 point sources embedded randomly into a non-absorbing film (e=12). The electric field was then registered for a sufficiently long time on 20 points arbitrary placed within the film. The decay rate was evaluated from the decay of the Fourier transform of the time signal, averaged over all recording points. As also shown on FIG. 4, it is found that the decay rate increases with increasing reduced frequencies. At large reduced frequencies, waves escape more easily and absorption enhancement due to multiple scattering is then reduced. On the other hand, out-of-plane losses facilitate wave coupling to the film.

Through the investigations, the existence of large photon decay rates and significant reductions of the scattering mean free path, depending on the scattering properties of the defects has been thus revealed. Such features may be used to control interaction between waves and matter. While an efficient coupling between three-dimensional space and finite-size systems is required from a practical point of view, strong scattering reduces the transport mean free path in the disordered material and is therefore expected to enhance the effects of gain and absorption on transport.

Applicants have found that this absorption enhancement is valid for arbitrary angle of incidence of the electromagnetic wave on the (X,Y) plane. Finite-difference time-domain simulations have been performed to study the absorption of planewaves incident on the film of the invention at an arbitrary angle. FIG. 5 shows the absorption spectrum of the bare film and of the randomly structured film for both s- and p-polarized planewaves incident at an angle of 40°. The absorption enhancement remains large for both s- and p-polarizations. The absorption enhancement therefore also takes place at large angles of incidence.

Furthermore, in order to show the confinement, i.e. the localization of modes that remains confined within a small area of the waveguide, samples were obtained by creating in a 260 nm thick planar waveguide of GaAs, in which 25 µm×25 µm broad arrays of air pores (=the scatterers), placed at random positions, are realized. A series of samples was made for four hole diameters (180 nm, 200 nm, 220 nm, 250 nm), and for each hole diameter samples were made of different filling fractions (20, 25, 30, 35, 40 and 45%). FIG. 11 shows a SEM image of a sample with hole diameter 200 nm and filling fraction 25%.

A large number of local sources have been created inside the samples by infiltrating them using two different colloidal solutions of PbS quantum dots diluted in toluene, having spectra centered around 1.3 µm (QDs(a)) or around 1.55 µm (QDs(b)) (depending on the spectral region of interest) with a spectral width of 200 nm. The experimental apparatus is built around a commercial Scanning Near Field Optical Microscope (Twinsnom, Omicron). The SNOM is used in an illumination/collection geometry: the quantum dots are excited through the SNOM tip with a 780 nm diode laser, and the luminescence signal is collected again through the same tip. The luminescence signal is fed through a spectrometer and detected by an InGaAs array. This allows to record point-by-point (with a combined spatial and spectral resolution of 250 nm and 0.5 nm, respectively) the local emission spectrum of the quantum dots. These measurements provide therefore at the same time the spectral information, the spatial distribution of the intensity of the modes and structural information of the sample (via the mechanical feedback signal of the SNOM). Note that the embedded sources are excited locally in this SNOM configuration, so that the collected signal is proportional to the efficiency of the local source to emit into the observed mode (which is determined by the local density of states) as well as the spatial distribution of the intensity of this mode.

The measurement technique allows to extract the spatial distribution of the intensity at each specific wavelength. By performing such an analysis it is found that for each spectrally isolated peak in the associated spatial distribution of the intensity is strongly localized in space. FIG. 12 shows the near-field intensity map of such a localized mode as recorded on Sample. The intensity is concentrated in a small region of space, which still covers several scattering elements. This means that the combined trapping probably due to 2D Anderson localization and index guiding in the third direction, indeed allows to confine light to a small spatial region. The inset of FIG. 12 shows the normalized intensity spectrum taken at the position corresponding to the maximum of the mode intensity.

Therefore, the coupling waveguide of the invention can be also used to capture and localize the incident light. Applicants have also noted that, when the mode is localized, the absorption enhancement is even higher.

The waveguide of the invention do not require large thicknesses for an efficient coupling and, more generally, for an enhancement of the absorption. A low amount of material may then be used, which, in turn, means low production costs and low weight of the final device. The thickness of the film does not have an important relevance on the light localization on the plane, increasing the thickness of the core of the waveguide implies that the latter becomes a multimodal waveguide, without affecting the enhanced absorption process. However the biggest advantage of the invention is obtained with thin films, i.e. films in which the ratio between the physical thickness of the film and the absorption mean free path is equal or lower than 1, due to the fact that in a bare film having the same characteristics the absorption is very low.

The structures of the invention solves therefore the problems discussed with reference to the prior art of record. In particular, the bandwidth of operation is large (see FIG. 3 in which this absorption increase is obtained for a wide range of wavelengths of incident radiation) due to the fact that the defects have a large scattering cross-section on a broad range of wavelengths. It is scalable to all frequencies, which means that given the wavelength of the incident wave it is possible to realize such an absorbing system properly scaling the dimensions.

In addition, disorder implies the creation of electromagnetic modes in the structure spanning the entire reciprocal space and lossy in the out-of-plane direction. Therefore, coupling from three-dimensional space to the two-dimensional film is efficient, even at large angles of incidence (see FIG. 5).

The waveguide of the invention do not require large thicknesses for an enhancement of the absorption. A low amount of material may then be used, which in turns means low costs production, low weight of the final device.

Structures of the invention are not sensitive to the position of one particular defect. Therefore, inaccuracy in the position of particular defects is irrelevant.

The invention may be used for technologies in solar energy (thin-film solar cells, thermo-photovoltaics), heating, electromagnetic shielding, etc.

These objects and others, which will become clear from the following description, are achieved by the invention with a waveguide obtained in accordance with the appended claims.

BRIEF DESCRIPTION OF THE DRAWINGS

Further features and advantages of a coupling waveguide according to the invention will become more clearly apparent from the following detailed description thereof, given with reference to the accompanying drawings, where.

PREFERRED EMBODIMENTS OF THE INVENTION

Figure 1:
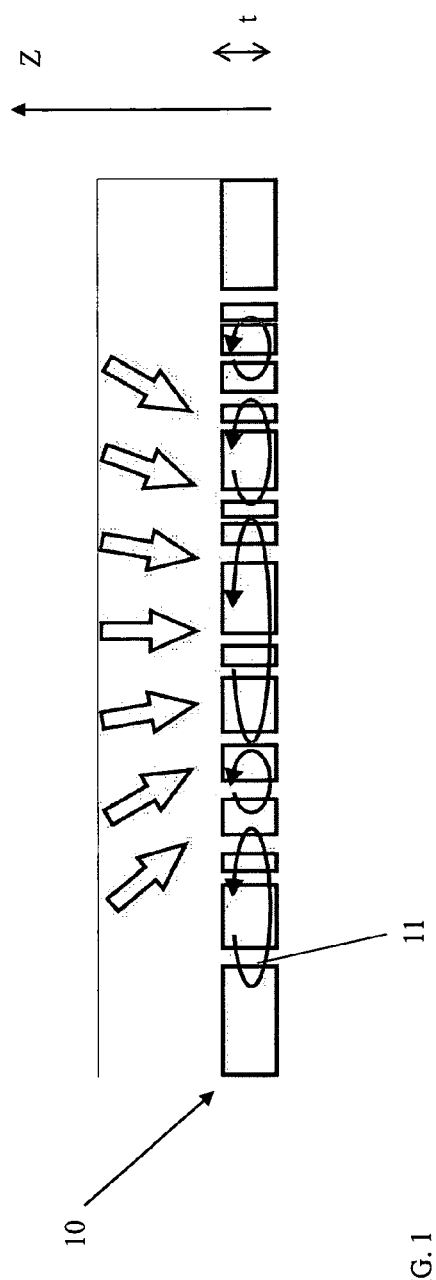
FIG. 1 is a schematic cross section of a waveguide according to the invention. Electromagnetic waves incident at arbitrary angles on the randomly structured film are coupled efficiently to the system. Multiple scattering in the plane of the system yield strong interference effects.
Figure 2:
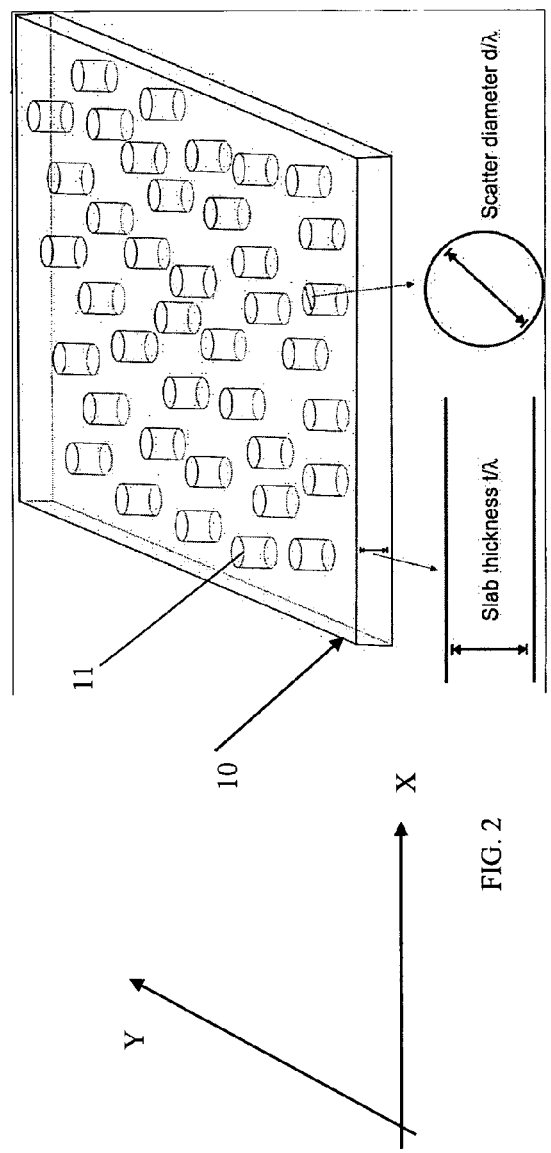
FIG. 2 is a schematic perspective view of the waveguide of FIG. 1 in which the scatterers are a set of circular cylinders placed randomly in a dielectric material of finite thickness.
Figure 10:
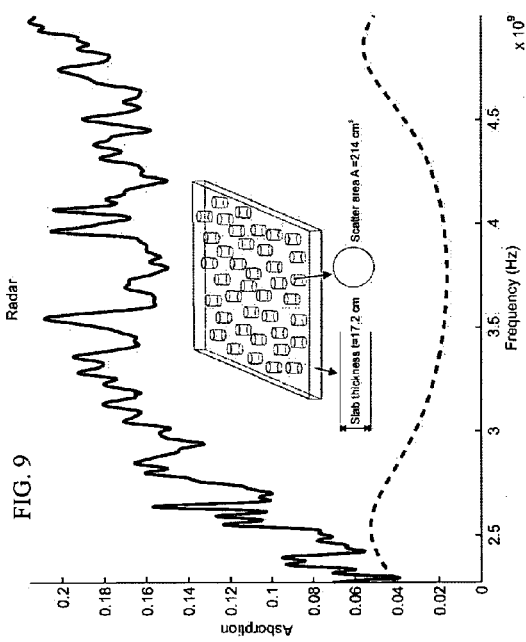

With initial reference to FIGS. 1 and 2, 10 indicates a waveguide according to the present invention. The waveguide includes a portion in which a plurality of scatterers, each of which is indicated with 11 in the figures, distributed according to a random distribution. The parameter s used is equal to 130%. The waveguide 10 can be realized preferably in a polymeric material or in silicon, and the physical thicknesses t of the film along the Z direction is preferably comprised between 50 nm and 100,000 nm, from 10 μm to 1000 μm, from 1 mm to 10 mm.

The waveguide 10 includes a film made of semiconductor material surrounded by either glass, or a polymeric material, $SiO_2$, etc., as a substrate and air above.

The film in the portion in which the scatterers are formed, defines at least a flat surface, i.e. a surface on the (X,Y) plane is defined where the film is substantially flat. In such a portion, electromagnetic waves may impinge the film at substantially any angle with respect to the normal of the (X,Y) plane.

The scatterers are in this preferred example cylindrical holes having a circular cross section and they are preferably through-holes, i.e. they span the whole thickness t of the film and they are filled with air, therefore the refractive index of the scatterers is equal to 1.

The cross section along the (X,Y) plane of the scatterers has an area which is comprised in the range defined by equation (7), in particular having the impinging wave a wavelength of 0.6 μm, the resulting area is equal to $A_{min}=2.5\times10^{-3}$ μm²; $A_{max}=9.2\times10^{-2}$ μm².

Figure 12:
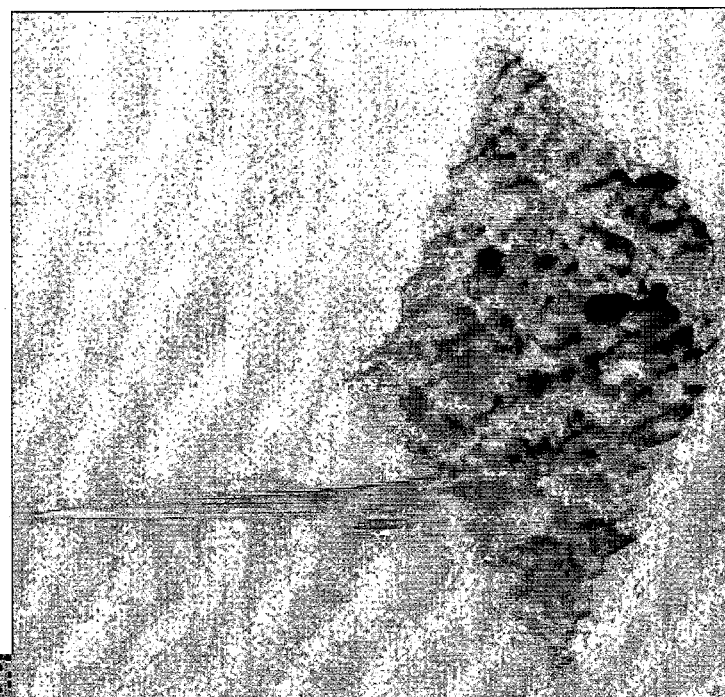
FIG. 12 is a three dimensional view of one of the many spatially localized modes as observed in the Sample of FIG. 2. The spatial dimension of the image is 13.5 μm×13.5 μm. The spatial extent of this mode is around 1.4 μm. Note that the edge of the window corresponds to the border of the scanning area and not the border of the sample (which is far away from the position of the mode). The inset shows the spectrum recorded in the position where the mode has maximum intensity.
Figure 11:
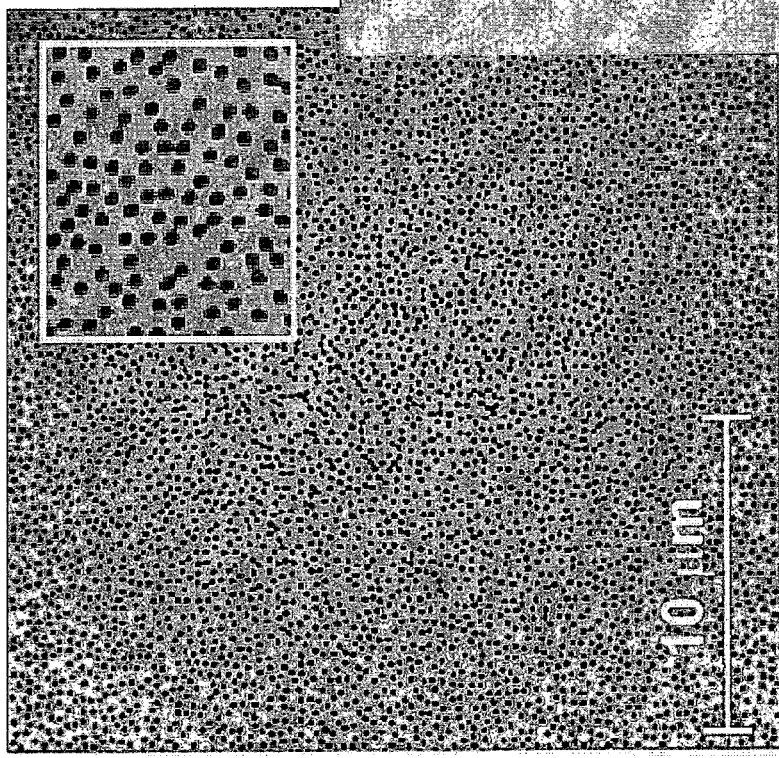
FIG. 11 shows a SEM image of a waveguide of the invention.

As shown in FIG. 12 this waveguide 10 shows mode localization.

In addition, the effect of the enhancement of absorption is present for a broad frequency range (typically $\Delta\lambda/\lambda_{cent}>1$).

It is to be understood that the waveguide 10 of the invention traps modes and enhance the absorption for all frequencies of the electromagnetic spectrum, provided that all physical dimensions of the waveguide (i.e. the area of the cross section of the scatterers) are scaled with the wavelength $\lambda_{centr}$ of the impinging electromagnetic wave (scalability of Maxwell equations). The absorption enhancement effect in the waveguide of the invention is further evidenced by performing finite-difference time-domain simulations for various filling fractions. Results are summarized in the following Table 1.

TABLE 1

| Filling fraction (%) | Absorption enhancement (%) for $0.5 < a/\lambda < 1.1$ |
|---|---|
| 0 | 0 |
| 5 | 164% |
| 10 | 258% |
| 15 | 332% |
| 20 | 382% |
| 25 | 381% |
| 30 | 374% |
| 35 | 375% |
| 40 | 313% |
| 45 | 294% |
| 50 | 241% |

In the above table, the enhancement is considered with respect to a bare slab with no scatterers and the results are an integral of the absorption between $0.5 < a/\lambda < 1.1$. This table is valid for any wavelength of the impinging wave because it is a function of a/λ where a is an arbitrary unit of length defined in the summary of invention.

It is clear from the above table that at low filling fractions the inclusion of scatterers in the film increases the absorption. Already for a filling fraction of 5%, absorption is enhanced by 164%. Increasing the density of scatterers then reduces the scattering mean free path in the film and further increases interaction. Above 35% filling fraction, the absorption enhancement starts again to decrease. This behavior may be attributed to the fact that multiple scattering, although stronger, starts being not sufficient anymore to compensate for the removed amount of absorbing material. Absorption enhancement therefore relies on an interplay between the strength of multiple scattering and the physical amount of absorbing material in the film. Therefore, preferably, the filling factor of the scatterers in the waveguide of the invention is comprised between 15% and 50%.

Applicants have then investigated how the enhancement effect varies with absorption in the medium. In substance, more absorption for a bare film can be obtained either by considering a thick, weakly absorbing, film or a thin, strongly absorbing, one. Simulations on bare films and randomly structured films have been performed for film permittivity e=12+1i, 12+0.1i and 12+0.01i, (at a/λ=0.6), corresponding to absorption length of 0.92a, 9.19a, 91.9a, and film thicknesses 0.1a, 0.25a, 0.5a, 1a. The ratio of integrated absorption have been calculated in the reduced frequency range 0.5<a/λ<1.1 for a planewave at normal incidence. Results are summarized in the following Table 2:

TABLE 2

|  | Absorption Length = 9.1889 a Film thickness (units of a) | | | | Film Thickness = 0.26 a Absorption Length (units of a) | | |
|---|---|---|---|---|---|---|---|
|  | 0.1 | 0.25 | 0.5 | 1 | 0.92 | 9.19 | 91.9 |
| Average absorption of the film (%) | 0.74 | 3.09 | 5.73 | 10.3 | 25.6 | 3.3 | 0.34 |
| Absorption enhancement (%) | 513 | 402 | 350 | 246 | 60 | 374 | 807 |

Results evidence the tendency of having a larger enhancement of absorption precisely when the absorption by the bare film is smaller. This effect may be understood by considering that the contribution of interferences due to multiple scattering on the absorption is smaller compared to that of the actual absorption in the film if the latter is strong. In the limit where most of electromagnetic waves are absorbed by the bare film, either by using a very thick film and/or a very strong absorption, the role played by multiple scattering on absorption becomes irrelevant. The structure of the invention therefore plays a more significant role for weakly absorbing films. Thus, for strongly absorbing films, similar performance may be achieved by using thinner randomly structured films.

Figure 6:
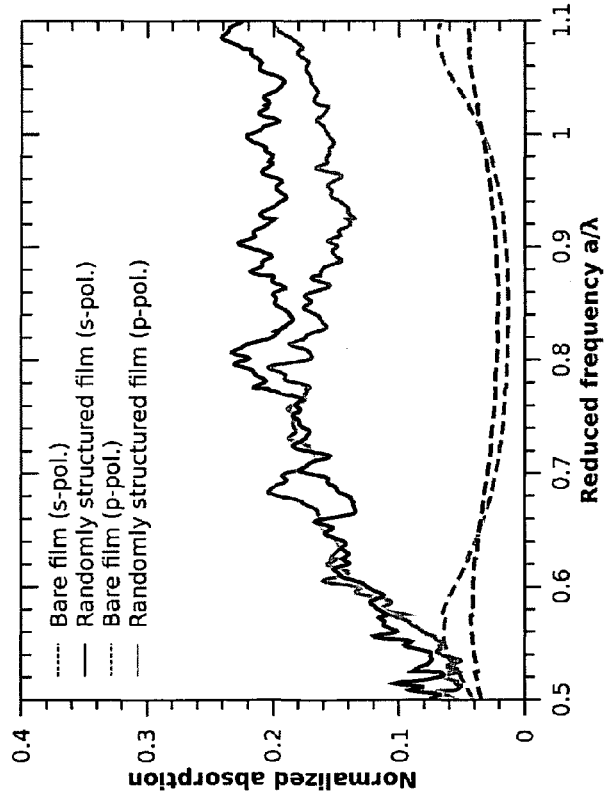
FIG. 6 is a graph showing the waveguide absorption as a function of its thickness (the dots represent a film having a thickness of 50 nm, 75 nm, 100 nm, 150 nm and 200 nm) with a substrate having refractive index n=2.5 and with a perpendicularly incident light the filling fraction of the scatterers is equal to 30%.
Figure 7:
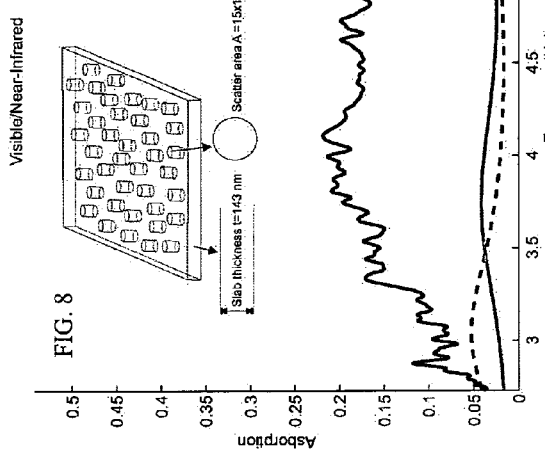
FIGS. 7-10 are graphs analog to the graph of FIG. 3 for the waveguide of the invention and for a bare film for different wavelengths of the incident light.
Figure 8:
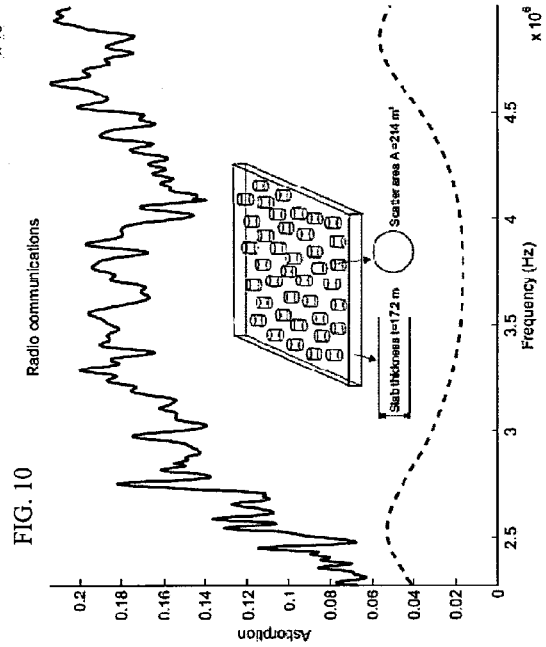
Figure 9:
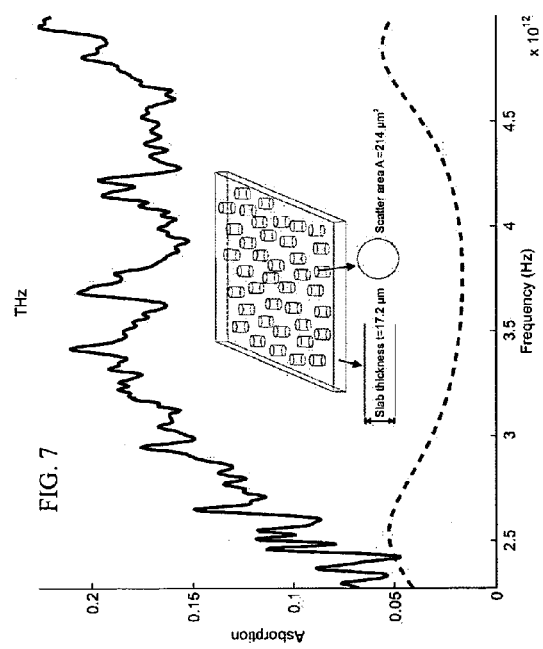

FIG. 6 shows the results obtained for the calculation of the normalized absorption (averaged over the range 0.7<a/λ<0.9) vs. the thickness of the waveguide for a waveguide according to the invention compared to the average absorption of the bare film (i.e. without scatterers). The simulations are performed for an asymmetric system, in which the waveguide has a refractive index equal to 3.5, in an asymmetric configuration, i.e. having as the upper cladding air (refractive index 1) and as substrate a material having a refractive index equal to 2.5. As clearly shown, below 200 nm, the absorption is substantially identical to the absorption of a bare slab, the enhancement is present only above 200 nm where the first guided mode is formed within the waveguide. The incident radiation is consider to be along the Z axis.

In order for example to realize a waveguide suitable to be used in a solar cell, two different goals can be achieved, which are increase the absorption of the film of a given thickness or have comparable absorption efficiency of the film with less material.

As a first step, therefore, the material to be used to realize the waveguide for the solar cell (or for any other application) is chosen, and the central wavelength to be absorbed $\lambda_{centr}$ is also selected. $\lambda_{centr}$ is selected so that in the range of wavelength of interest this wavelength is substantially "in the center".

The material in which the film is realized and the central wavelength define the refractive index $n_{film}$ and the absorption length $l_a$ of the film.

The thickness t of the film such that it is preferably smaller than the absorption length $t<l_a$. Given the refractive index of the defects $n_{scatt}$, which is defined when the material filling the defects is also selected (the defects/scatterers can be also left empty, i.e. they are filled with air) the reference diameter of the defects is calculated, $$\Phi_{ref} = \frac{n_{scatt}}{n_{film}} \cdot \lambda_{centr}.$$

From this, the range of the defect area is then also obtained: $\pi \cdot (\Phi_{ref}/6)^2 \leq A_{scatt} \leq \Phi_{ref}^2$. The defects have to be realized so that their area lies within this range.

Figure 3:
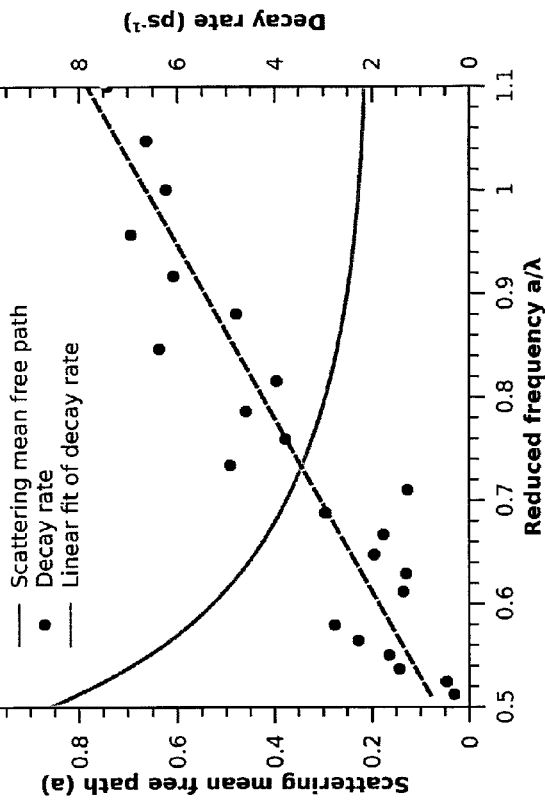
FIG. 3 is a graph showing the absorption spectrum for a bare film (black dashed line), periodically structured film (gray solid line, the film of the invention shown in FIGS. 1 and 2) and randomly structured film (black solid line)
Figure 4:
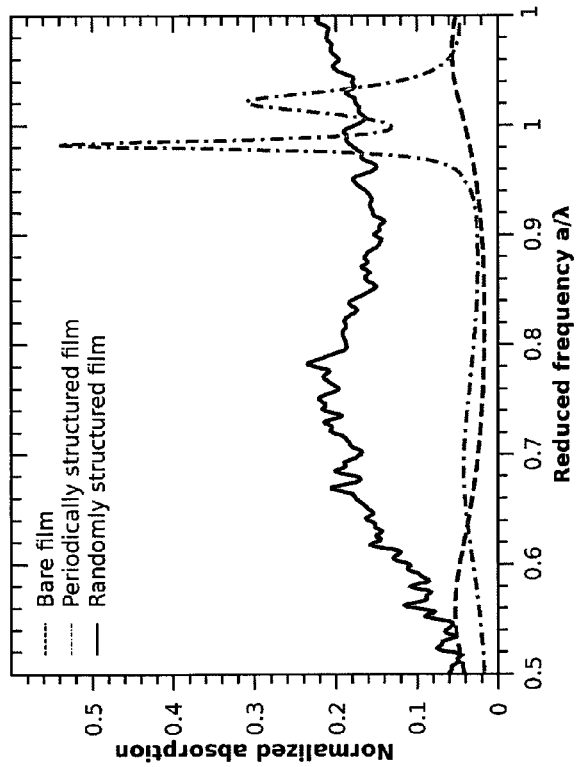
FIG. 4 is a graph showing the scattering mean free path of p-polarized electromagnetic waves in the waveguide of FIGS. 1 and 2 for a scatterer filling fraction of 30% (solid line). Decay rate of electromagnetic waves in the waveguide of FIGS. 1 and 2 for a scatterer filling fraction of 30% is also shown (finite-difference time-domain simulations: black dots; linear fit: dashed line)
Figure 5:
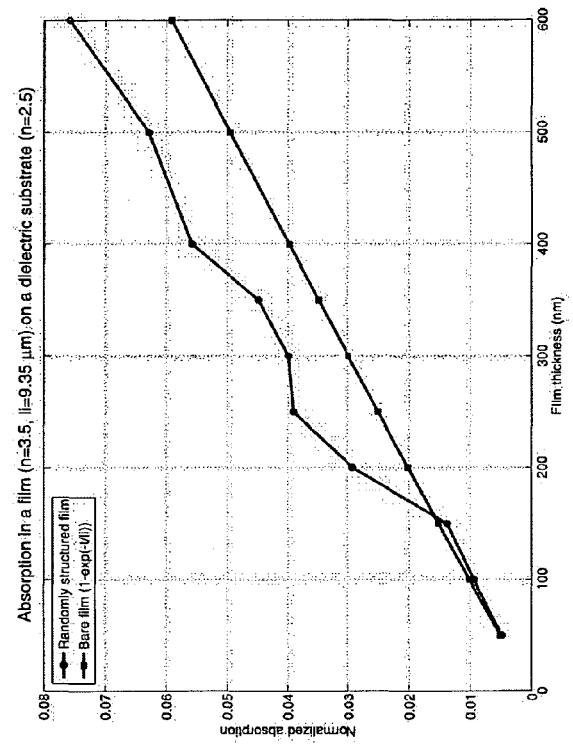
FIG. 5 is a graph showing the ratios of integrated absorption calculated in the reduced frequency range from $0.5 < a/\lambda < 1.1$ for the s- and p-polarizations equal 347% and 448%, respectively.

The filling fraction of defects (5%, 10%, ... 30%, etc.) is then also chosen, according to the importance given to the two goals which have been described above, i.e. the amount of material saved and the absorption enhancement. As shown, a family of curves of the type shown in FIG. 3 is present, a curve for each filling fraction. FIG. 3 is obtained for a filling fraction equal to 30%, the thickness is 0.26a, permittivity is 12, the absorbing length 9.19a and the diameter of the scatterers (which in this case are cylinders which circular cross section) is 0.25a. The same parameters are used for FIG. 5 where the incident angle is now 40° and FIG. 6, where the thickness is varied. As an example, in case of solar cells, the central wavelength of interest $\lambda_{centr}$ is selected to be 600 nm and a possible configuration is a silicon film having a refractive index of $n_{film}=3.5$ while the scatterers are filled with air, having therefore a refractive index $n_{scatt}$ equal to 1.

Performing the calculation, the diameter of reference is $$\Phi_{ref} = \frac{n_{scatt}}{n_{film}} \cdot \lambda_{centr} \approx 171 \text{ nm}$$

and thus the scatterers have to be realized on the film so that their area is comprised between 2565 nm² ≤ $A_{scatt}$ ≤ 92315 nm². The filling fraction is chosen according to the desired absorption.

The invention claimed is:

1. A waveguide (10) on which an electromagnetic wave impinges, said electromagnetic wave having a wavelength λ included in a given interval Δλ of interest centered on a $\lambda_{centr}$, said waveguide comprising:
   a film defining a surface on a plane (X,Y) on which said electromagnetic waves are apt to impinge, and having a thickness in a direction (Z) substantially perpendicular to said surface, said film being realized in a material having a first refractive index ($n_{film}$);

a plurality of scatterers (11), said scatterers being randomly distributed in two directions in at least a portion of said surface of said film, said scatterers having a substantially constant cross section along said substantially perpendicular direction (Z); said scatterers being realized in a material having a second refractive index ($n_{scatt}$), said second refractive index being lower than said first refractive index ($n_{film}$);

wherein the wavelength of the incident electromagnetic waves is comprised between $$0.1 < \frac{\Delta\lambda}{\lambda_{centr}} \leq 3$$

and wherein the area ($A_{scatt}$) of the cross section of said scatterers is comprised between $\pi \cdot (\Phi_{ref}/6)^2 \leq A_{scatt} \leq \pi \cdot \Phi_{ref}^2$, where $$\Phi_{ref} = \frac{n_{scatt}}{n_{film}} \cdot \lambda_{centr}.$$

2. The waveguide (10) according to claim 1, wherein said film is a waveguide core.

3. The waveguide (10) according to claim 1, wherein the number of scatterers in said portion is equal or higher than 10.

4. The waveguide (10) according to claim 1, wherein said random distribution of said scatterers $s = \langle x^2 \rangle / \langle x \rangle$ is larger than 50%.

5. The waveguide (10) according to claim 4, wherein $50\% \leq s \leq 200\%$.

6. The waveguide (10) according to claim 1, wherein an absorption mean free path of the material forming said film is larger than the thickness (t) of the film.

7. The waveguide (10) according to claim 1, wherein the scatterers are filled with air.

8. The waveguide (10) according to claim 1, wherein said scatterers (11) extend through the whole thickness (t) of said film.

9. The waveguide (10) according to claim 1, wherein said scatterers (11) have a substantially circular cross section.

10. The waveguide (10) according to claim 1, including an upper and a lower cladding, said upper and lower cladding being in contact with two opposite sides of said film, said upper and lower cladding having a first and second permittivity, respectively, said first and second permittivity being substantially identical.

11. The waveguide (10) according to claim 10, wherein said first and second permittivity are lower than the permittivity of the material forming said film.

12. The waveguide (10) of claim 10, wherein the scatterers (11) are realized only in said film and not in said upper or lower cladding.

13. The waveguide (10) according to claim 1, wherein the portion of waveguide which includes said scatterers (11) is substantially flat.

14. The waveguide (10) according to claim 1, wherein a filling factor of the scatterers in said waveguide is below 80%.

15. The waveguide (10) according to claim 14, wherein the filling factor of the scatterers in said waveguide is comprised between 15% and 50%.

16. A solar cell, including at least one of the waveguides of claim 1.

17. A method to enhance absorption of electromagnetic waves having a wavelength $\lambda$ included in a given interval $\Delta\lambda$ of interest centered on a $\lambda_{centr}$, said electromagnetic waves impinging on a surface (X,Y) of a film, said film having a thickness in a direction (Z) substantially perpendicular to said surface, said method comprising the steps of:

selecting a first material in which said film is realized having a first refractive index $n_{film}$;

selecting a second material having a second refractive index ($n_{scatt}$), said second refractive index being lower than said first refractive index ($n_{film}$);

calculating a reference diameter $$\Phi_{ref} = \frac{n_{scatt}}{n_{film}} \cdot \lambda_{centr}$$

and a range of defect area is $\pi \cdot (\Phi_{ref}/6)^2 \leq A_{scatt} \leq \pi \cdot \Phi_{ref}^2$ (A);

realizing a random distribution of a plurality of scatterers (11), said scatterers being randomly distributed in two directions in at least a portion of said surface of said film, said scatterers having a substantially constant cross section along said substantially perpendicular direction (Z), being realized in said second refractive index and having an area comprised within equation (A).

18. The method according to claim 17, comprising the step of selecting a thickness (t) of said film so that the absorption mean free path of the material forming said film is larger than the thickness (t) of the film.

* * * * *